(12) United States Patent
Gready

(10) Patent No.: US 11,079,335 B2
(45) Date of Patent: Aug. 3, 2021

(54) HYBRID OVERLAY TARGET DESIGN FOR IMAGING-BASED OVERLAY AND SCATTEROMETRY-BASED OVERLAY

(71) Applicant: KLA-TENCOR CORPORATION, Milpitas, CA (US)

(72) Inventor: David Gready, Tigard, OR (US)

(73) Assignee: KLA-Tencor Corporation, Milpitas, CA (US)

( * ) Notice: Subject to any disclaimer, the term of this patent is extended or adjusted under 35 U.S.C. 154(b) by 312 days.

(21) Appl. No.: 15/995,731

(22) Filed: Jun. 1, 2018

(65) Prior Publication Data

US 2018/0364179 A1 Dec. 20, 2018

Related U.S. Application Data

(60) Provisional application No. 62/521,782, filed on Jun. 19, 2017.

(51) Int. Cl.
| | |
|---|---|
| *G01N 21/95* | (2006.01) |
| *G01N 21/956* | (2006.01) |
| *G01B 11/27* | (2006.01) |
| *G01N 21/47* | (2006.01) |

(Continued)

(52) U.S. Cl.
CPC ......... *G01N 21/9501* (2013.01); *G01B 11/27* (2013.01); *G01N 21/4788* (2013.01); *G01N 21/95607* (2013.01); *G03F 7/70633* (2013.01); *G03F 7/70683* (2013.01); *H01L 22/12* (2013.01); *H01L 22/20* (2013.01); *H01L 22/30* (2013.01)

(58) Field of Classification Search
CPC ........... G01N 21/9501; G01N 21/4788; G01N 21/95607; G01B 11/27; G03F 7/70633; G03F 7/70683; H01L 22/12; H01L 22/20; H01L 22/30
See application file for complete search history.

(56) References Cited

U.S. PATENT DOCUMENTS

| | | | |
|---|---|---|---|
| 2003/0223630 A1* | 12/2003 | Adel ................... | G03F 7/70633 382/145 |
| 2004/0137651 A1* | 7/2004 | Smedt ................. | G01N 21/956 438/16 |
| 2005/0193362 A1 | 9/2005 | Phan et al. | |

(Continued)

FOREIGN PATENT DOCUMENTS

| | | | | |
|---|---|---|---|---|
| WO | 2004076963 | A2 | 9/2004 | |
| WO | WO-2004076963 | A2 * | 9/2004 | ........... G03F 9/7084 |

OTHER PUBLICATIONS

ISA/KR, International Search Report and Written Opinion for PCT/US2018/037430 dated Oct. 4, 2018.

*Primary Examiner* — Raymond L Nimox
(74) *Attorney, Agent, or Firm* — Hodgson Russ LLP

(57) ABSTRACT

Designs for a hybrid overlay target design that includes a target area with both an imaging-based target and a scatterometry-based target are disclosed. The imaging-based overlay target design can include side-by-side grating structure. A scatterometry-based overlay target design at a different location in the target area can include grating-over-grating structure. A method of measuring the hybrid overlay target design and a system with both an imaging optical system and a scatterometry system for measuring the hybrid overlay target design are also disclosed.

10 Claims, 8 Drawing Sheets

(51) Int. Cl.
*G03F 7/20* (2006.01)
*H01L 21/66* (2006.01)

(56) References Cited

U.S. PATENT DOCUMENTS

| | | | |
|---|---|---|---|
| 2013/0208279 A1* | 8/2013 | Smith | G03F 7/70633 356/401 |
| 2013/0342831 A1 | 12/2013 | Levinski et al. | |
| 2014/0065736 A1* | 3/2014 | Amir | G03F 7/70683 438/14 |
| 2014/0353527 A1 | 12/2014 | MacNaughton et al. | |
| 2014/0375984 A1* | 12/2014 | Choi | G01N 21/93 356/73 |
| 2015/0204664 A1 | 7/2015 | Bringoltz et al. | |
| 2015/0323471 A1* | 11/2015 | Sapiens | G01N 21/93 356/73 |
| 2016/0117847 A1* | 4/2016 | Pandev | G03F 7/70633 348/87 |
| 2016/0313658 A1* | 10/2016 | Marciano | H01L 22/20 |
| 2017/0336198 A1 | 11/2017 | Adel et al. | |
| 2017/0356853 A1 | 12/2017 | Sapiens et al. | |

\* cited by examiner

HYBRID OVERLAY TARGET DESIGN FOR IMAGING-BASED OVERLAY AND SCATTEROMETRY-BASED OVERLAY

CROSS-REFERENCE TO RELATED APPLICATIONS

This application claims priority to the provisional patent application filed Jun. 19, 2017 and assigned U.S. App. No. 62/521,782, the disclosure of which is hereby incorporated by reference.

FIELD OF THE DISCLOSURE

This disclosure relates to overlay metrology.

BACKGROUND OF THE DISCLOSURE

In various manufacturing and production environments, there is a need to control alignment between various layers of samples or within particular layers of such samples. For example, in the semiconductor manufacturing industry, electronic devices may be produced by fabricating a series of layers on a substrate. Some or all of the layers can include various structures. The relative position of such structures both within particular layers and with respect to structures in other layers affects the performance of completed electronic devices.

The relative position of structures within such a sample can be called overlay. The measurement of overlay error between successive patterned layers on a wafer is an important process control technique in integrated circuit manufacturing. Overlay accuracy generally pertains to the determination of how accurately a first patterned layer aligns with respect to a second patterned layer disposed above or below it and to the determination of how accurately a first pattern aligns with respect to a second pattern disposed on the same layer.

Metrology processes are used at various steps during a semiconductor manufacturing process to monitor and control one or more semiconductor layer processes. Overlay error is one of the characteristics being monitored and controlled. The overlay error is typically determined with an overlay target having structures formed on one or more layers of a work piece (e.g., semiconductor wafer). If the two layers or patterns are properly formed, then the structure on one layer or pattern tends to be aligned relative to the structure on the other layer or pattern. If the two layers or patterns are not properly formed, then the structure on one layer or pattern tends to be offset or misaligned relative to the structure on the other layer or pattern. Overlay error is the misalignment between any of the patterns used at different stages of the semiconductor fabrication processes.

Overlay metrology targets are printed to measure registration between two or more layers. The structures on the wafer may take the form of gratings, and these gratings may be periodic. If the two layers or patterns are properly formed, then the structure on one layer or pattern may be aligned relative to the structure on the other layer or pattern. Scatterometry overlay measurement and imaging-based overlay measurement use different target designs due to their different measurement methods.

Various technology and processes for measuring overlay have been developed and employed with varying degrees of success. More recently, various efforts have been focused on utilizing radiation scatterometry as a basis for overlay metrology. Overlay metrology has become a technique that helps enable lithographic patterning. Overlay measurements are done by various algorithms, which extract the overlay term from the target's asymmetry. The overlay metrology target is designed in such a way so the overlay would induce an asymmetry signature in the reflected signal.

When overlay errors are observed, an overlay measurement may be used to apply corrections and to keep overlay errors within desired limits. For example, overlay measurements may be fed into an analysis routine that calculates scanner corrections, as well as other statistics, which may be used by an operator in order to better align the lithography tool used in the process. In typical fabrication operations, semiconductor manufacturing processes are run in batches called lots. A lot, or a wafer lot, is defined as a quantity of wafers which are processed together as a single group. Conventional overlay monitor and control techniques generally take a single set of scanner corrections and apply the same set for all wafers in the same lot.

Previous techniques used imaging-based and/or scatterometry-based targets, each one in a different location on the wafer. These were measured separately. Use of two different targets at different locations increases chip area, which increases the cost of metrology and reduces available space on the wafer.

Furthermore, scatterometry overlay measurement and imaging-based overlay measurement run on different measurement sequences, and only one of the imaging and scatterometry measurement methods is used at a time. When using two different targets, two measurement sequences are needed. This results in longer measurement time due to, for instance, navigation to different locations or wafer alignment (e.g., 0 and 180 degrees).

Therefore, an improved overlay target, methods of measuring the overlay target, and related measurement systems are needed.

BRIEF SUMMARY OF THE DISCLOSURE

An overlay target is disclosed in a first embodiment. The overlay target includes an imaging-based overlay target design in a cell that includes side-by-side grating structure and a scatterometry-based overlay target design at a different location in the cell that includes grating-over-grating structure. Gratings in the grating-over-grating structure are shifted with respect to each other. The scatterometry-based overlay target design has a different pitch compared to the imaging-based overlay target design.

The scatterometry-based overlay target design may have a different critical dimension compared to the imaging-based overlay target design.

The imaging-based overlay target design and the scatterometry-based overlay target design can each be disposed on two adjacent layers of the overlay target. In an instance, a pattern for the imaging-based overlay target design on one of the two adjacent layers is different from the imaging-based overlay target design on another of the two adjacent layers.

The imaging-based overlay target design and the scatterometry-based overlay target design can be in a cell of the overlay target and can be oriented along a common axis of orientation. There may be a plurality of the cells on the overlay target. Two of the cells may have axes of orientation that are perpendicular to each other.

A method is provided in a second embodiment. The method includes acquiring an overlay target of a wafer on a chuck with an imaging optical system. This forms an acquisition image. The overlay target includes an imaging-based overlay target design and a scatterometry-based overlay target design. The overlay target is measured with the imaging optical system using the acquisition image. The overlay target is measured with the scatterometry system using the acquisition image.

Measuring with the scatterometry system may be prior to measuring with the imaging optical system.

The scatterometry-based overlay target design may have a different critical dimension compared to the imaging-based overlay target design.

The imaging-based overlay target design and the scatterometry-based overlay target design can each be disposed on two adjacent layers of the overlay target. In an instance, a pattern for the imaging-based overlay target design on one of the two adjacent layers is different from the imaging-based overlay target design on another of the two adjacent layers.

The imaging-based overlay target design and the scatterometry-based overlay target design can be in a cell of the overlay target and can be oriented along a common axis of orientation. There may be a plurality of the cells on the overlay target. Two of the sections may have axes of orientation that are perpendicular to each other.

The measuring with the imaging optical system and the measuring with the scatterometry system may occur at least partially simultaneously.

A system is provided in a third embodiment. The system includes a chuck configured to hold a wafer having an overlay target, an imaging optical system configured to measure the overlay target on the chuck, a scatterometry system configured to measure the overlay target on the chuck, and a processor in electronic communication with the imaging optical system and the scatterometry system. The overlay target includes an imaging-based overlay target design and a scatterometry-based overlay target design. The imaging optical system and the scatterometry system are configured to measure the same overlay target.

The system can include an imaging optical system acquisition module configured to acquire the overlay target on the chuck with the imaging optical system thereby forming an acquisition image. The imaging optical system and the scatterometry system can use the acquisition image.

The imaging optical system and the scatterometry system can be configured to measure the overlay target at least partially simultaneously.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Overlay targets typically occupy an expensive location on an integrated circuit. Semiconductor manufacturers generally seek to decrease measurement time and wafer area of these overlay targets. Space on a wafer can be saved, measurement time can be made faster, and a comparison of results from the two technologies can be performed by combining imaging-based and scatterometry-based targets. Thus, including two targets in an area of an integrated circuit and measuring both overlay targets at the same time would provide benefits to the semiconductor manufacturing process.

Embodiments of the disclosure include a hybrid overlay metrology target, which can reduce both area on an integrated circuit for the overlay target and measurement time. Scatterometry overlay acquisition for imaging overlay measurement may be used.

Imaging-based overlay targets and scatterometry-based overlay targets are typically measured on different target designs. Imaging-based overlay target designs can be based on a side-by-side grating. Scatterometry-based overlay target designs can be based on a grating-over-grating structure in which the gratings are shifted in respect to one another. The imaging-based overlay target design and scatterometry-based overlay target design may not have the same pitch. Embodiments disclosed herein include a hybrid overlay target design that includes a target area with both an imaging-based overlay target and a scatterometry-based overlay target. This design can reduce measurement time by enabling imaging-based overlay measurement on an acquisition image of a scatterometry-based measurement.

Imaging-based overlay targets and scatterometry-based overlay targets can be printed independently. The imaging-based overlay targets and scatterometry-based overlay targets can be printed at different locations and are measured with two different measurement sequences. Printing a hybrid target design, where each target still can have its own pitch and critical dimension characteristics, can reduce area of the target, reduce measurement time, and enable a hybrid optical imaging and scatterometry tool. Measurement time can be reduced by navigating only once to the hybrid target and using the acquisition image, which is normally taken for scatterometry measurement, for the imaging-based measurement. This way imaging-based overlay target measurement is done practically at the same time as the scatterometry-based overlay target measurement.

Figure 1:
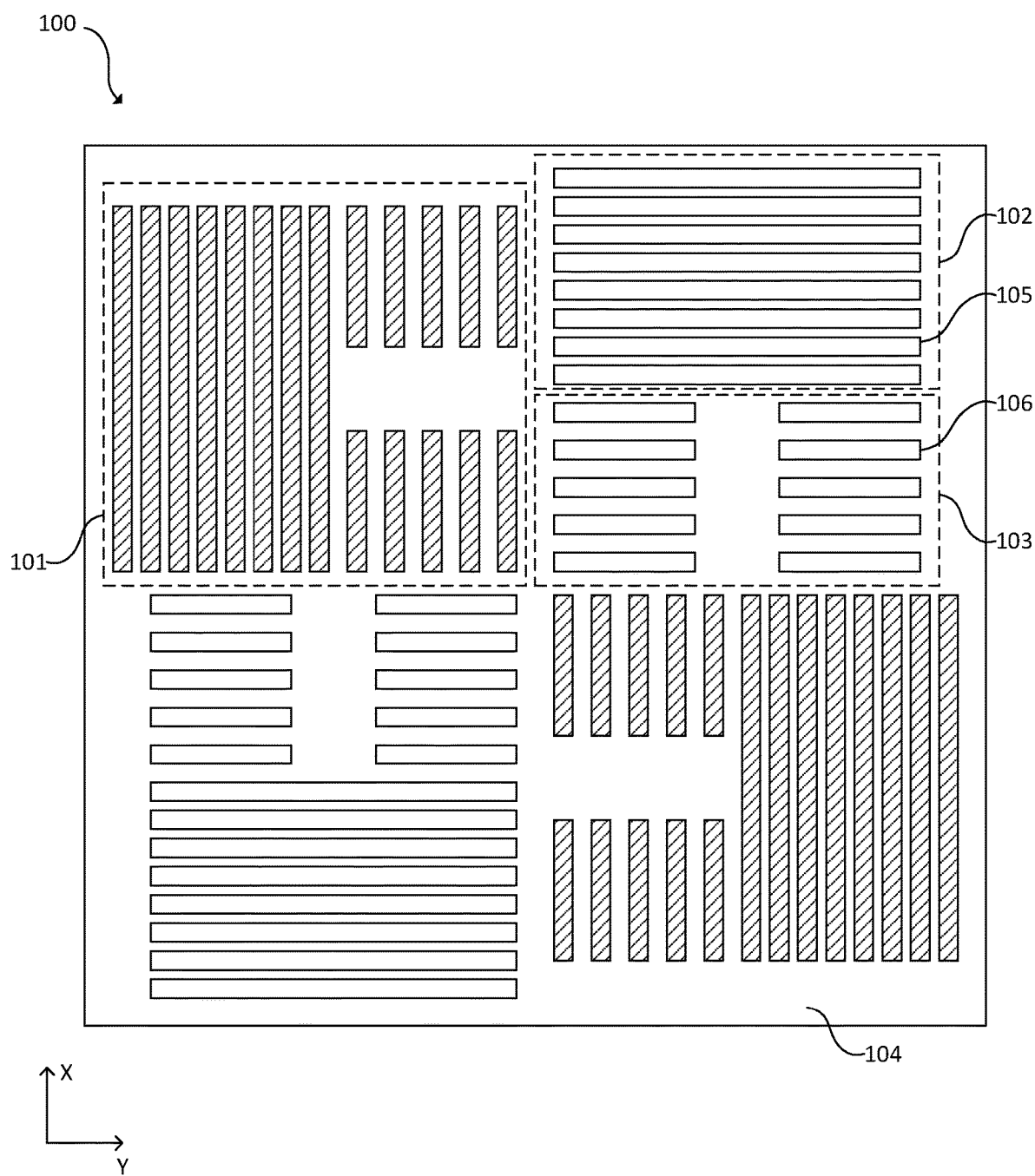
FIG. 1 is a block diagram of a first embodiment of an overlay target in accordance with the present disclosure.

FIG. 1 is a block diagram of a first embodiment of an overlay target 100. The overlay target 100 includes multiple cells 101 (outlined in dotted line). Four cells 101 are illustrated, but different numbers of cells are possible. Four cells 101 can be used for two-layer overlay measurements, including two for each orientation (X or Y). More cells may be included if three layers are being measured. For example, if three layers are used, the imaging-based target may have three sets of gratings instead of two, but may still be in four cells. In another example, if three layers are measured then there may be eight cells, four for each orientation. The three layer example may be used for scatterometry.

Each cell 101 of the overlay target 100 includes a scatterometry-based overlay target design 102 (outlined in dotted line) and an imaging-based overlay target design 103 (outlined in dotted line). The scatterometry-based overlay target design 102 and an imaging-based overlay target design 103 are at different locations in the cell 101 of the overlay target area 104.

The scatterometry-based overlay target design 102 includes a grating-over-grating structure. The gratings 105 in the grating-over-grating structure are shifted with respect to each other. The period of the gratings 105 (pitch) is the same for all layers of the scatterometry-based overlay target design 102 for a given orientation and is determined based on the structure and material composition of the measured wafer, as well as the measurement tool illumination configuration. For scatterometry-based overlay target design 102, the pitch value may be of the order of the illumination source wavelength, which can be approximately hundreds of nanometers. The lower limit of the grating pitch may be governed by the physical diffraction limit, while the upper limit may be determined by the illumination condition, wavelength, or angle of incidence.

The imaging-based overlay target design 103 includes side-by-side grating structure 106. The gratings in the side-by-side grating structure 106 do not necessarily have the same period (pitch). Each grating period can be determined according to the wafer structure and material composite and measurement tool configuration and performance. A typical value of a grating pitch for an imaging-based overlay target design 103 can be hundreds of nanometers up to a few micrometers. The lower limit for target pitch may be governed by the physical diffraction limit and the upper may be bound by the information content, as larger pitch values imply less bars for a given target size and lithography process.

The scatterometry-based overlay target design 102 can have a different pitch compared to the imaging-based overlay target design 103. The target pitch for a scatterometry-based overlay target design 102 may be approximately of the order of the wavelength, but may not be too far from it. For an imaging-based overlay target design 103, the pitch can be much longer than the wavelength, but not shorter than the wavelength.

The scatterometry-based overlay target design 102 can have a different critical dimension compared to the imaging-based overlay target design 103. For each orientation, each target is comprised of two cells. Each cell has two grating for each target, scatterometry and imaging. The corresponding gratings can have the same critical dimensions, but the critical dimensions within the cell can differ between the two. A scatterometry-based overlay target design 102 and an imaging-based overlay target design 103 can have different critical dimensions.

The imaging-based overlay target design 103 and the scatterometry-based overlay target design 102 are in a cell 101 of the overlay target 100 and can be oriented along a common axis of orientation or can be oriented along different axes of orientation. For example, the imaging-based overlay target design 103 and the scatterometry-based overlay target design 102 in the cell 101 (with the dotted line around it) are oriented along the X-axis. Neighboring zones 101 may include imaging-based overlay target designs 103 and the scatterometry-based overlay target designs 102 oriented along different axes. The orientation may be defined as the direction perpendicular to the bars.

Two of the cells 101 can have axes of orientation that are perpendicular to each other.

Imaging-based overlay target designs 103 and the scatterometry-based overlay target designs 102 can share the same orientation or not share the same orientation. Designs can be such that a single orientation is measured using scatterometry (imaging) based and the other orientation is measured using imaging (scatterometry). This scenario can happen when both orientations measure different layer couples.

Figure 2:
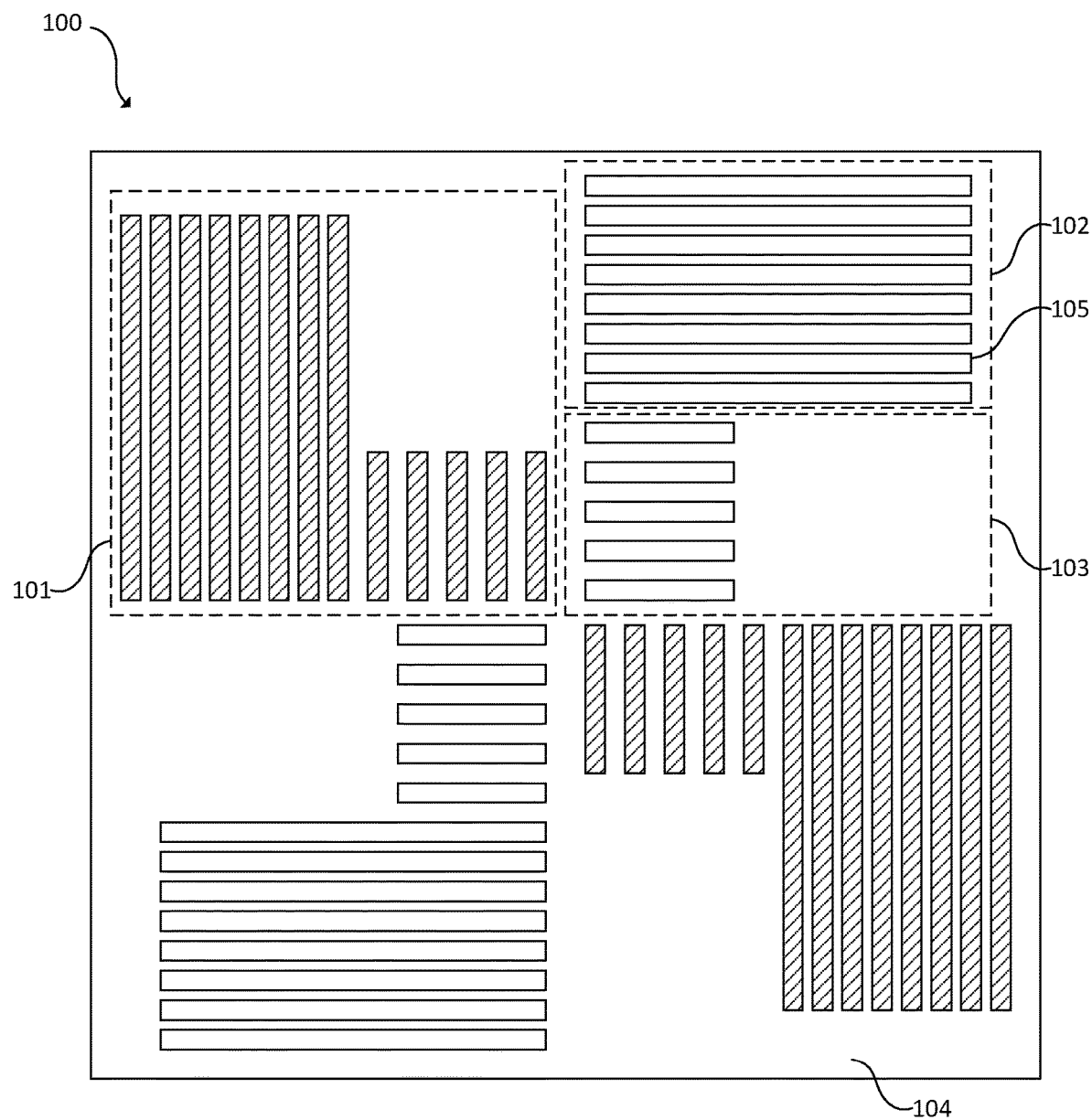
FIG. 2 is a block diagram of a first layer of the first embodiment of the overlay target.
Figure 3:
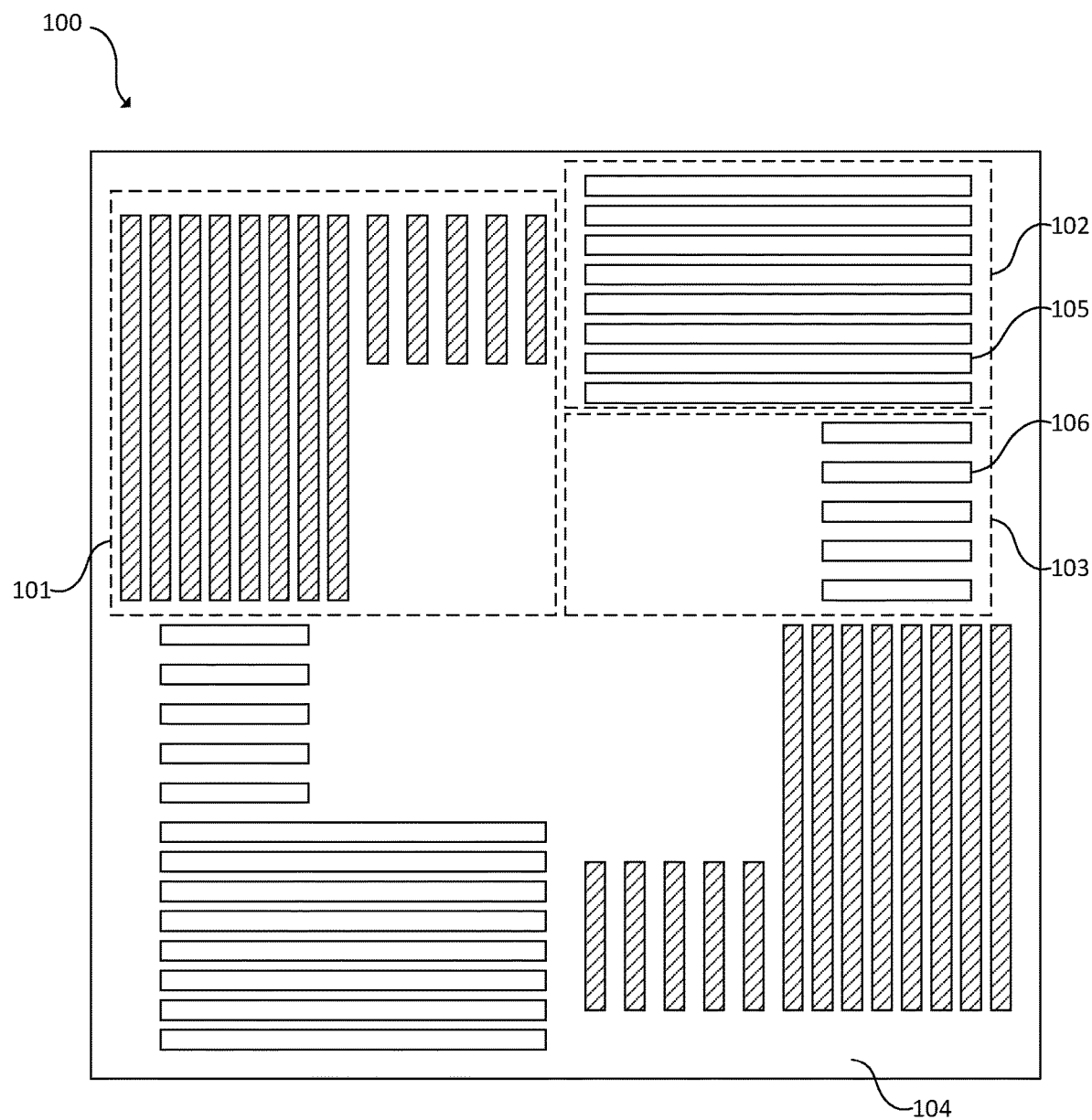
FIG. 3 is a block diagram of a second layer of the first embodiment of the overlay target.

The imaging-based overlay target design 103 and the scatterometry-based overlay target design 102 can each be disposed on two adjacent layers of the overlay target. FIG. 2 is a block diagram of a first (e.g., bottom) layer of the first embodiment of the overlay target 100 and FIG. 3 is a block diagram of a second (e.g., top) layer of the first embodiment of the overlay target 100. The first and second layers of the overlay target 100 can be formed separately. The particular positioning of the first and second layers can vary from that described in this example. Thus, the first layer can be a top layer and the second layer can be a bottom layer.

As seen in FIGS. 2 and 3, a pattern for the imaging-based overlay target design 103 on one of the two adjacent layers is different from the imaging-based overlay target design 103 on another of the two adjacent layers. Thus, the imaging-based overlay target design 103 is different on the first and second layers. While two layers are disclosed in FIGS. 2 and 3, use of three or more layers in the overlay target is possible.

The scatterometry-based overlay target design 102 may the same on both the first and second layers or may be different on the first and second layers if the designs share the same pitch.

Use of two or more layers can be applicable to other overlay target designs besides the overlay target 100.

Figure 4:
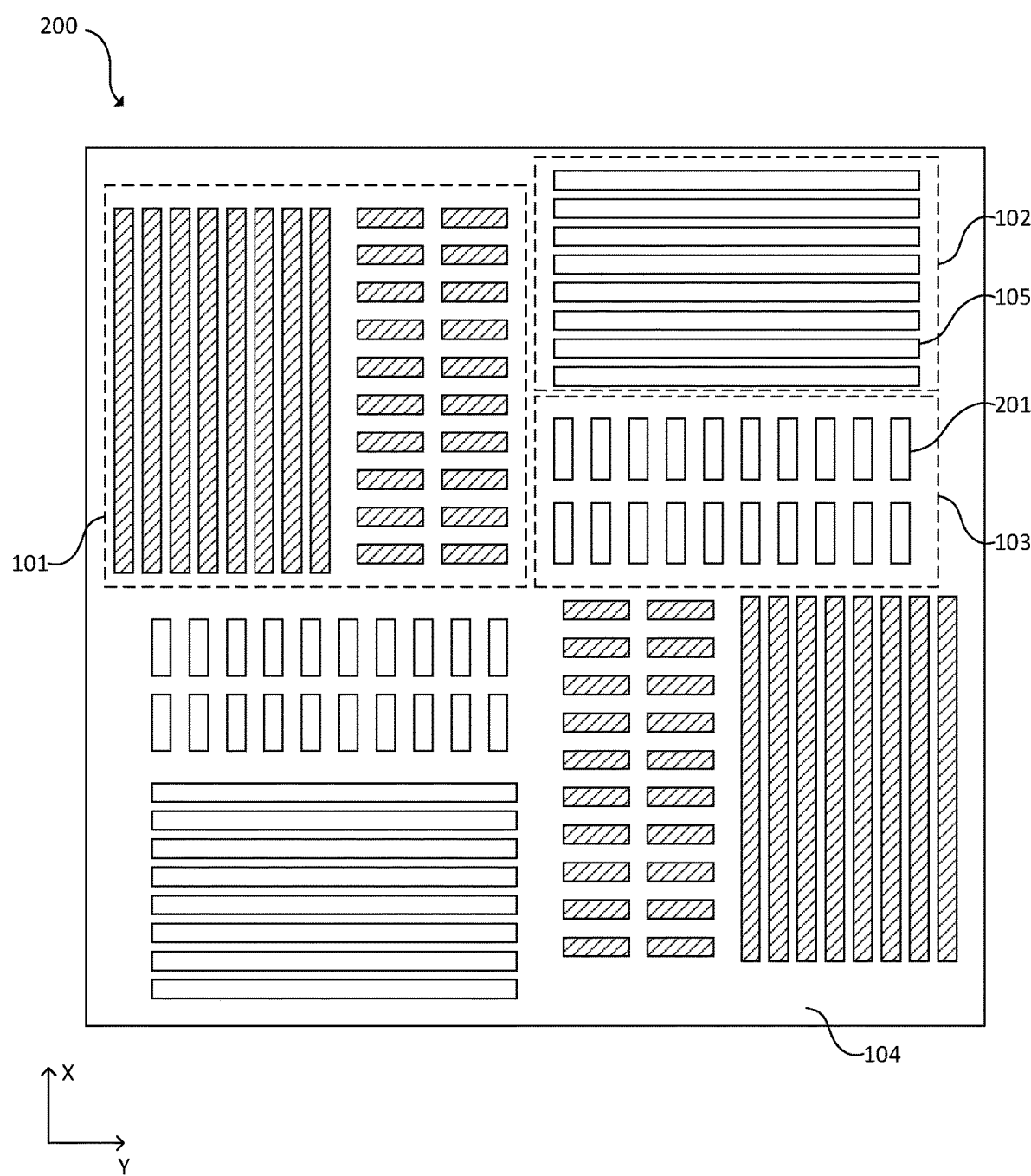
FIG. 4 is a block diagram of a second embodiment of an overlay target in accordance with the present disclosure.

FIG. 4 is a block diagram of a second embodiment of an overlay target 200. The overlay target 200 is similar to the overlay target 100, but the imaging-based overlay target design 103 includes a side-by-side grating structure 201 that is oriented along a perpendicular axis compared to the orientation of the gratings 105 in the grating-over-grating of the scatterometry-based overlay target design 102 in the same cell 101. The orientation may be defined as the direction perpendicular to the bars. The scatterometry-based overlay target design 102 is illustrated as having a single layer, while the imaging-based overlay target design 103 includes a double layer. The scatterometry-based overlay target design 102 may be a double or triple layer. Additional layers for either the scatterometry-based overlay target design 102 or the imaging-based overlay target design 103 are possible.

Figure 5:
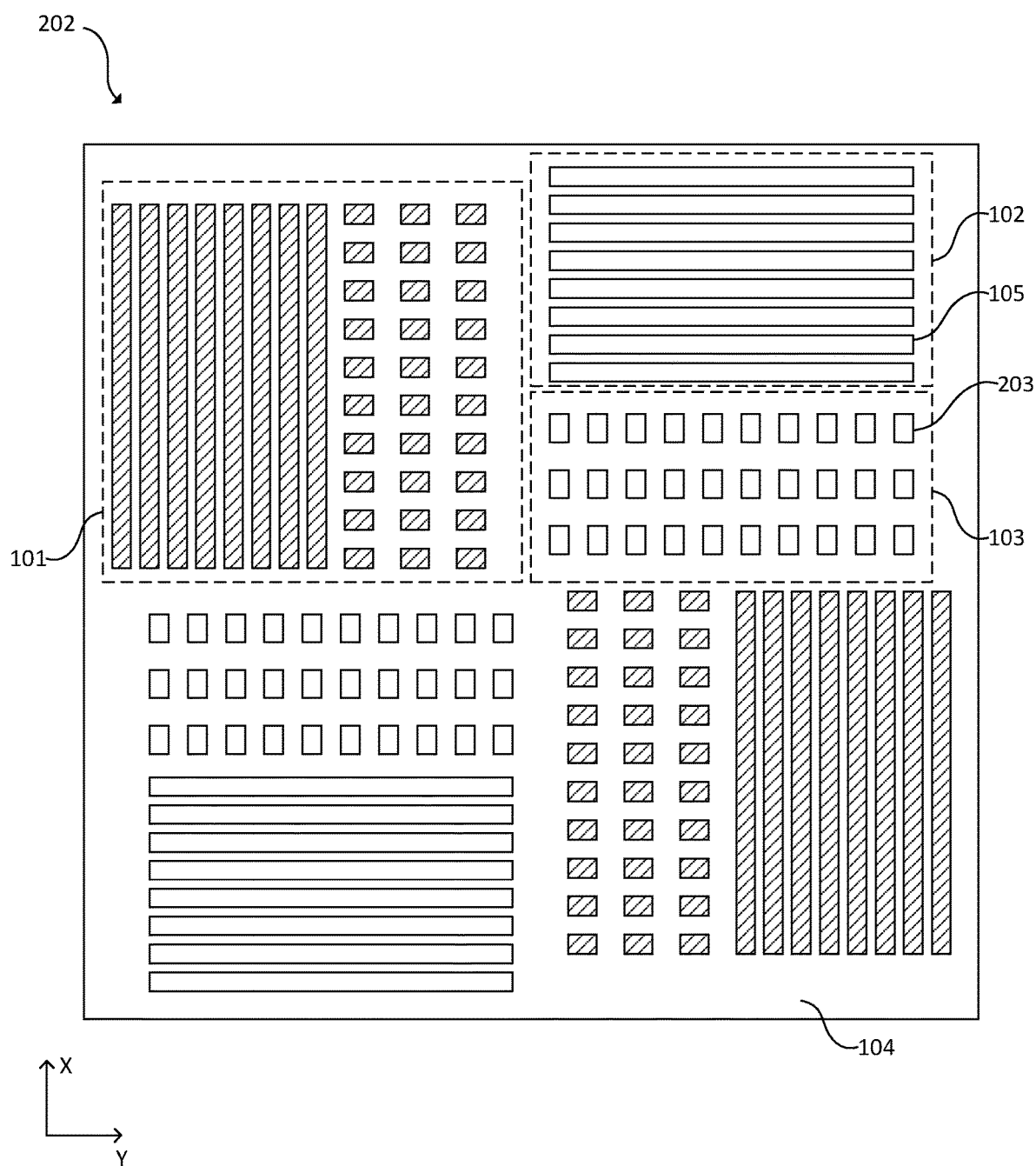
FIG. 5 is a block diagram of a third embodiment of an overlay target in accordance with the present disclosure.

FIG. 5 is a block diagram of a third embodiment of an overlay target 202. The overlay target 202 is similar to the overlay target 100, but the imaging-based overlay target design 103 includes a side-by-side grating structure 203 that is oriented along a perpendicular axis compared to the orientation of the gratings 105 in the grating-over-grating of the scatterometry-based overlay target design 102 in the same cell 101. The orientation may be defined as the direction perpendicular to the bars. The scatterometry-based overlay target design 102 is illustrated as having a single layer, while the imaging-based overlay target design 103 includes a triple layer. The scatterometry-based overlay target design 102 may be a double or triple layer. Additional layers for either the scatterometry-based overlay target design 102 or the imaging-based overlay target design 103 are possible.

Figure 6:
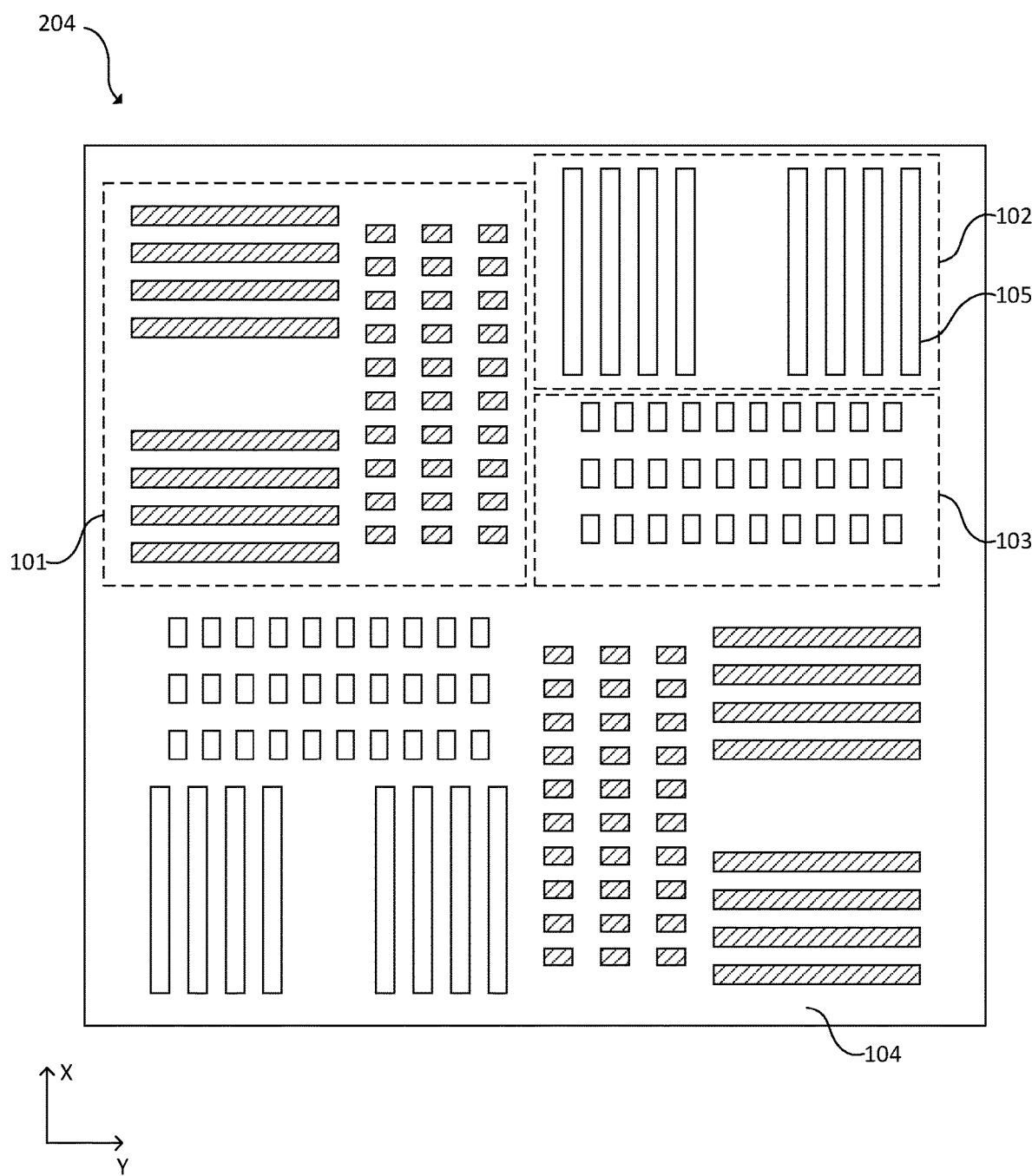
FIG. 6 is a block diagram of a fourth embodiment of an overlay target in accordance with the present disclosure.

FIG. 6 is a block diagram of a fourth embodiment of an overlay target 204. The overlay target 204 is similar to the overlay target 100, but the imaging-based overlay target design 103 and scatterometry-based overlay target design 102 are not in the same orientation side by side. The imaging-based overlay target design 103 and scatterometry-based overlay target design 102 also can be measuring only one orientation, meaning that a target can be scatterometry for Y direction and imaging for X direction or vice versa.

Embodiments of the overlay targets disclosed herein, including those of FIG. 1, 4, 5, or 6 provide multiple advantages. Less area on a chip is used for the scatterometry-based overlay target design and the imaging-based overlay target design. These designs can provide shorter measurement time in hybrid tools that provide both imaging and scatterometry functions.

Other designs besides those of FIG. 1, FIG. 4, FIG. 5, or FIG. 6 may provide the same benefits. FIG. 1, FIG. 4, FIG. 5, and FIG. 6 are merely examples.

Furthermore, a position of the imaging-based overlay target design 103 and a position of the scatterometry-based overlay target design 102 in the same cell 101 may be reversed. Thus, the positions of these overlay target designs may be reversed from that illustrated in FIG. 1 or one of FIGS. 4-6.

Figure 7:
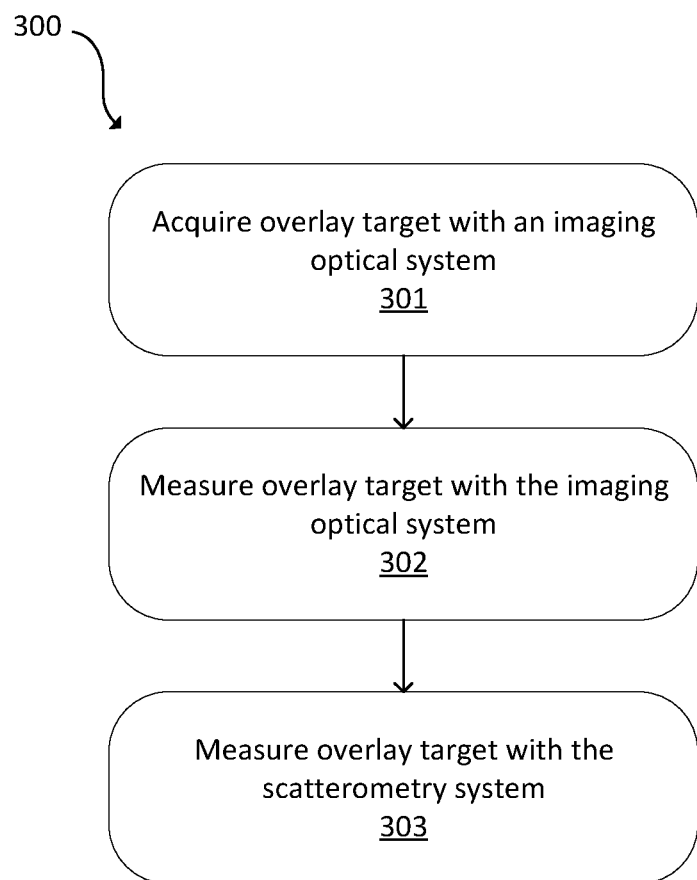
FIG. 7 is a block diagram of a method in accordance with the present disclosure.

FIG. 7 is a block diagram of a method 300. A semiconductor manufacturer can combine the imaging-based overlay target design and scatterometry-based overlay target design into a hybrid form. In the embodiments disclosed herein, the system moves to the target and acquires the target using the imaging-based overlay physics. Using this image, the system performs imaging measurement and then does the scatterometry measurement. The disclosed sequence saves time navigating to two different locations and uses an acquisition step to gain an additional information.

Imaging-based overlay and scatterometry-based overlay measurements are not done together because the target design and the location of targets are different. To measure the disclosed target, the measurement sequence includes both scatterometry and imaging. The acquisition of the scatterometry target can be done using the physics of the imaging-based target. Then the acquired image is used to measure the imaging-based overlay. Then a scatterometry-based measurement is performed on the scatterometry-based target.

At 301, an overlay target of a wafer on a chuck is acquired with an imaging optical system. This forms an acquisition image. The overlay target is measured with the imaging optical system at 302 using the acquisition image. At 303, the overlay target is measured with the scatterometry system using the acquisition image. The wafer remains on the chuck between steps 301 and 303.

An acquisition sequence can be included. During the acquisition sequence, an image of a field of view that is larger than the target is acquired. If the acquisition is done using the imaging measurement setup (e.g., recipe physics), it can be used to do the imaging measurement regardless of the scatterometry sequence. This way instead of running two measurement sequences, a single measurement sequence is running, but two measurements can be performed sequentially, at least partially simultaneously, or at the same time.

While disclosed in a particular sequence, measuring with the scatterometry system at 303 may occur prior to the measuring with the imaging optical system at 302. Embodiments disclosed herein use a single sequence in order to measure both imaging and scatterometry targets. In the disclosed sequence, the imaging based target can be measured first because the acquisition is performed before the scatterometry-based measurement.

Measuring with the scatterometry system at 303 also may occur at least partially simultaneously with the measuring with the imaging optical system at 302.

The method 300 may use the overlay target 100 of FIG. 1, the overlay target 200 of FIG. 4, the overlay target 202 of FIG. 5, the overlay target 204 of FIG. 6, or other overlay targets. Both the scatterometry-based overlay target design and the imaging-based overlay target design may be in the same field of view during the measurements. The disclosed target and measurement sequence can enable measurement of imaging-based overlay and scatterometry-based overlay together or separately.

This method 300 avoids measuring two different targets for imaging and scatterometry at different locations with two different measurement sequences. These measurements previously could not be compared due to different target locations, measurement technologies, or measurement sequences. Imaging-based and scatterometry-based targets were previously printed at different locations. Different locations tend to yield different overlay values. Thus, comparison between measurements can be compromised due to real overlay values.

Each measurement sequence may need a specific sampling plan defined by an operator, which can be dependent on the specific target location. Thus, this method 300 also avoids defining two sampling plans.

Figure 8:
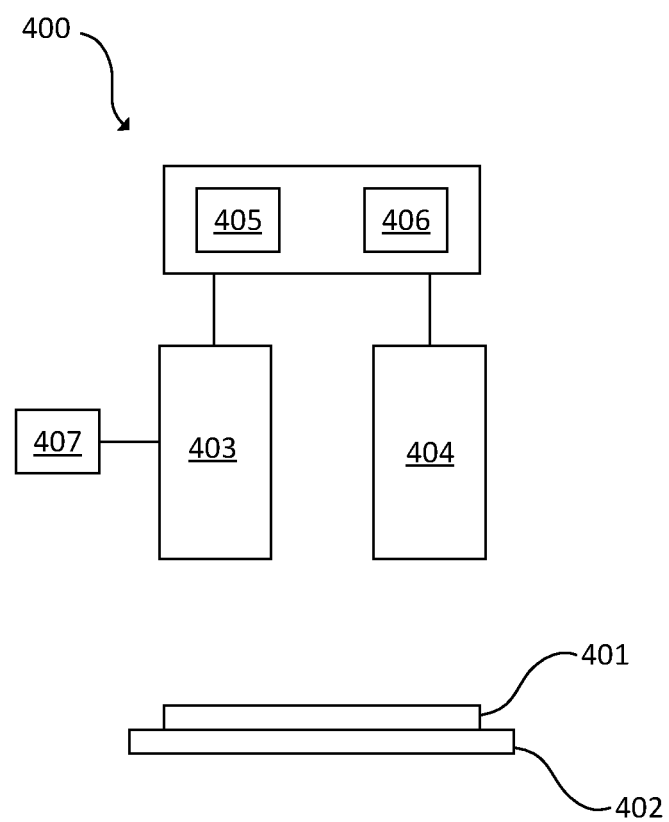
FIG. 8 is a block diagram of an embodiment of a system in accordance with the present disclosure.

FIG. 8 is a block diagram of an embodiment of a system 400. The system includes a chuck 402 configured to hold a wafer 401. The wafer 401 includes one or more overlay targets. The overlay target includes an imaging-based overlay target design and a scatterometry-based overlay target design, such as the overlay target 100 of FIG. 1, the overlay target 200 of FIG. 4, the overlay target 202 of FIG. 5, the overlay target 204 of FIG. 6, or other overlay targets.

The system 400 includes an imaging optical system 403 configured to measure the overlay target on the chuck 402. The imaging optical system 403 can include an illumination source oriented to direct radiation onto a specific location of the wafer 401 and one or more detectors oriented to detect an optical signal which from the wafer 401. The illumination source in the optical system 403 can generate an illumination beam directed at the wafer 401. The imaging optical system 403 also can include various lenses or optical components.

The imaging optical system 403 can be used for acquisition such that the imaging optical system 403 is part of the acquisition sequence of the scatterometry measurement.

The system 400 includes a scatterometry system 404 configured to measure the overlay target on the chuck 402. The scatterometry system 404 can be configured to measure the same overlay target as the imaging optical system 403.

The scatterometry system 404 can include an illumination source oriented to direct radiation onto a specified location of the wafer 401 and one or more detectors oriented to detect a scatterometry signal which has been scattered by the wafer 401. The illumination source in the scatterometry system 404 can generate an illumination beam directed at the wafer 401. The scatterometry system 404 also can include various lenses or optical components. The scatterometry system 404 can use the imaging optical system 403 or information from the imaging optical system 403 during the scatterometry sequence.

Measurements of the wafer 401 by the imaging optical system 403 and the scatterometry system 404 can be performed while the wafer 401 remains on the chuck 402. Thus, the wafer 401 may not move between measurement by the imaging optical system 403 and the scatterometry system 404. In an instance, a vacuum around the wafer 401 is not broken between measurements by the imaging optical system 403 and the scatterometry system 404. In an instance, one of the measurements by the imaging optical system 403 and the scatterometry system 404 occurs after the other. In another instance, the measurements by the imaging optical system 403 and the scatterometry system 404 occur at least partially simultaneously or at the same time.

A processor 405 is in electronic communication with an electronic data storage unit 406, the imaging optical system 403, and the scatterometry system 404. The processor 405 may include a microprocessor, a microcontroller, or other devices. The processor 405 can receive output from the imaging optical system 403 and the scatterometry system 404.

The system 400 can include an imaging optical system acquisition module 407 configured to acquire the overlay target on the chuck 402 with the imaging optical system 403. The optical system acquisition module 407 forms an acquisition image that can be used by the imaging optical system 403 or the scatterometry system 404. While illustrated as separate units, the imaging optical system acquisition module 407 may be part of the imaging optical system 403. The imaging optical system acquisition module 407 also may be part of the processor 405.

The processor 405 and electronic data storage unit 406 may be part of the system 400 or another device. In an example, the processor 405 and electronic data storage unit 406 may be part of a standalone control unit or in a centralized quality control unit. Multiple processors 203 or electronic data storage unit 406 may be used. In an embodiment, the processor 405 may be disposed in the system 400.

The processor 405 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 405 to implement various methods and functions may be stored in readable storage media, such as a memory in the electronic data storage unit 406 or other memory.

The processor 405 may be coupled to the components of the system 400 in any suitable manner (e.g., via one or more transmission media, which may include wired and/or wireless transmission media) such that the processor 405 can receive output. The processor 405 may be configured to perform a number of functions using the output.

The processor 405, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high speed processing and software, either as a standalone or a networked tool.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 405 may be configured to perform a number of functions using the output of the imaging optical system 403, and the scatterometry system 404, or other output. For instance, the processor 405 may be configured to send measurement results of the wafer 401. In another example, the processor 405 can determine an overlay error within the target. In another example, the processor 405 may be configured to send the output to an electronic data storage unit 406 or another storage medium. The processor 405 may be further configured as described herein.

The processor 405 may be configured according to any of the embodiments described herein. The processor 405 also may be configured to perform other functions or additional steps using the output of the system 400 or using images or data from other sources.

In another embodiment, the processor 405 may be communicatively coupled to any of the various components or sub-systems of system 400 in any manner known in the art. Moreover, the processor 405 may be configured to receive and/or acquire data or information from other systems (e.g., inspection results from an inspection system such as a review tool, a remote database including design data and the like) by a transmission medium that may include wired and/or wireless portions. In this manner, the transmission medium may serve as a data link between the processor 405 and other subsystems of the system 400 or systems external to system 400.

In some embodiments, various steps, functions, and/or operations of system 400 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 405 (or computer system) or, alternatively, multiple processors 405 (or multiple computer systems). Moreover, different sub-systems of the system 400 may include one or more computing or logic systems. Therefore, the above description should not be interpreted as a limitation on the present disclosure but merely an illustration.

An additional embodiment relates to a non-transitory computer-readable medium storing program instructions executable on a processor for inspecting a wafer, as disclosed herein. In particular, a processor, such as the processor 405, can be coupled to a memory in an electronic data storage medium, such as the electronic data storage unit 406, with non-transitory computer-readable medium that includes executable program instructions. The computer-implemented method may include any step(s) of any method(s) described herein. For example, processor 405 may be programmed to perform some or all of the steps of FIG. 7. The memory in the electronic data storage unit 406 may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), Streaming SIMD Extension (SSE), or other technologies or methodologies, as desired.

Each of the steps of the method may be performed as described herein. The methods also may include any other step(s) that can be performed by the processor and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method comprising:
    acquiring a region of a wafer on a chuck with an overlay target on a surface of the wafer in the region using an imaging optical system thereby forming an acquired image, wherein the overlay target includes gratings in an imaging-based overlay target design and gratings in a scatterometry-based overlay target design, wherein the gratings in the imaging-based overlay target design are in a side-by-side configuration, and wherein the gratings in the scatterometry-based overlay target design are in a grating-over-grating configuration;
    measuring the overlay target with a first illumination beam from the imaging optical system using the acquired image; and
    measuring the overlay target with a second illumination beam from the scatterometry system,
    wherein the imaging-based overlay target design and the scatterometry-based overlay target design are in a same field of view during the measuring with the first illumination beam and the second illumination beam.

2. The method of claim 1, wherein the measuring with the scatterometry system is prior to the measuring with the imaging optical system.

3. The method of claim 1, wherein the scatterometry-based overlay target design has a different critical dimension compared to the imaging-based overlay target design.

4. The method of claim 1, wherein the imaging-based overlay target design and the scatterometry-based overlay target design are each disposed on two adjacent layers of the overlay target.

5. The method of claim 4, wherein a pattern for the imaging-based overlay target design on one of the two adjacent layers is different from the imaging-based overlay target design on another of the two adjacent layers.

6. The method of claim 1, wherein the imaging-based overlay target design and the scatterometry-based overlay target design are in a cell of the overlay target and are oriented along a common axis of orientation, wherein there are a plurality of the cells on the overlay target, and wherein at two of the sections have axes of orientation that are perpendicular to each other.

7. The method of claim 1, wherein the measuring with the imaging optical system and the measuring with the scatterometry system occur at least partially simultaneously.

8. A system comprising:
    a chuck configured to hold a wafer having an overlay target on a surface of the wafer, wherein the overlay target includes gratings in an imaging-based overlay target design and gratings in a scatterometry-based overlay target design, wherein the gratings in the imaging-based overlay target design are in a side-by-side configuration, and wherein the gratings in the scatterometry-based overlay target design are in a grating-over-grating configuration;
    an imaging optical system with a first illumination source configured to measure the overlay target on the chuck;
    a scatterometry system with a second illumination source configured to measure the overlay target on the chuck; and
    a processor in electronic communication with the imaging optical system and the scatterometry system, wherein the imaging optical system and the scatterometry system are configured to measure the same overlay target, wherein the imaging-based overlay target design and the scatterometry-based overlay target design are in a same field of view of the imaging optical system and the scatterometry system.

9. The system of claim 8, further comprising an imaging optical system acquisition module configured to acquire the overlay target on the chuck with the imaging optical system thereby forming an acquired image, and wherein the imaging optical system uses the acquired image.

10. The system of claim 8, wherein the imaging optical system and the scatterometry system are configured to measure the overlay target at least partially simultaneously.

* * * * *